(12) United States Patent
Tateda et al.

(10) Patent No.: US 11,424,710 B2
(45) Date of Patent: Aug. 23, 2022

(54) MOTOR DRIVING DEVICE

(71) Applicant: FANUC CORPORATION, Yamanashi (JP)

(72) Inventors: Masaya Tateda, Yamanashi-ken (JP); Yasuyuki Matsumoto, Yamanashi-ken (JP)

(73) Assignee: FANUC CORPORATION, Yamanashi (JP)

(*) Notice: Subject to any disclaimer, the term of this patent is extended or adjusted under 35 U.S.C. 154(b) by 139 days.

(21) Appl. No.: 16/945,367

(22) Filed: Jul. 31, 2020

(65) Prior Publication Data

US 2021/0044241 A1 Feb. 11, 2021

(30) Foreign Application Priority Data

Aug. 6, 2019 (JP) .............................. JP2019-144506

(51) Int. Cl.
*H02P 27/08* (2006.01)
*G01R 31/50* (2020.01)
*H02P 29/024* (2016.01)
*H02P 11/04* (2006.01)

(52) U.S. Cl.
CPC .............. *H02P 27/08* (2013.01); *G01R 31/50* (2020.01); *H02P 11/04* (2013.01); *H02P 29/0241* (2016.02)

(58) Field of Classification Search
CPC ...... H02P 27/08; H02P 11/04; H02P 29/0241; H02P 23/14; H02P 27/06; G01R 31/50; H02M 1/0009; H02M 7/53871
See application file for complete search history.

(56) References Cited

U.S. PATENT DOCUMENTS

| | | | |
|---|---|---|---|
| 8,401,810 B2 * | 3/2013 | Sawada | H01J 49/0031 702/108 |
| 2011/0080125 A1 * | 4/2011 | Shimada | H02P 21/0003 318/400.09 |
| 2018/0062549 A1 * | 3/2018 | Murray | H02P 6/185 |
| 2018/0351494 A1 | 12/2018 | Tateda et al. | |
| 2020/0251982 A1 * | 8/2020 | Foube | H02P 27/08 |
| 2020/0403543 A1 * | 12/2020 | Imamura | H02P 6/08 |

FOREIGN PATENT DOCUMENTS

| | | |
|---|---|---|
| JP | 11-136950 A | 5/1999 |
| JP | 2006-271048 A | 10/2006 |
| JP | 2010-252595 A | 11/2010 |
| JP | 2011-226851 A | 11/2011 |
| JP | 2018-207566 A | 12/2018 |

* cited by examiner

*Primary Examiner* — Akm Zakaria
(74) *Attorney, Agent, or Firm* — Robert P. Michal, Esq.; Carter, DeLuca & Farrell LLP

(57) ABSTRACT

A motor driving device includes an acquisition unit configured to acquire multiple pieces of data in data acquisition periods having different lengths; a selection unit configured to select a piece of data from among the multiple pieces of data, based on timing at which a switching circuit switches switching devices; and a control unit configured to control the switching circuit based on the selected data.

16 Claims, 8 Drawing Sheets

US 11,424,710 B2

MOTOR DRIVING DEVICE

CROSS-REFERENCE TO RELATED APPLICATION

This application is based upon and claims the benefit of priority from Japanese Patent Application No. 2019-144506 filed on Aug. 6, 2019, the contents of which are incorporated herein by reference.

BACKGROUND OF THE INVENTION

Field of the Invention

The present invention relates to a motor driving device for driving a motor.

Description of the Related Art

Japanese Laid-Open Patent Publication No. 11-136950 discloses a motor driving device that samples output current of an inverter at crests of a triangular-wave carrier signal. According to Japanese Laid-Open Patent Publication No. 11-136950, mean current values are detected in certain periods from the crests of the carrier signal.

SUMMARY OF THE INVENTION

However, the motor driving device disclosed in Japanese Laid-Open Patent Publication No. 11-136950 is not always able to accurately detect the current supplied to the motor. When the current supplied to the motor cannot be detected accurately, then the motor cannot be controlled reliably based on the current value.

An object of the present invention is to provide a motor driving device that is capable of accurately detecting current supplied to the motor.

A motor driving device according to an aspect of the present invention includes: an inverter unit including a plurality of power device units respectively including switching devices, the inverter unit being configured to convert a direct-current voltage into a polyphase alternating-current voltage; a switching circuit configured to switch the switching devices; current sensors provided on lines configured to supply the polyphase alternating-current voltage to a motor; an acquisition unit configured to acquire data indicating currents flowing in the lines, based on outputs of the current sensors, the acquisition unit acquiring multiple pieces of data in data acquisition periods having different lengths; a selection unit configured to select a piece of data from among the multiple pieces of data acquired by the acquisition unit, based on timing at which the switching circuit switches the switching devices; and a control unit configured to control the switching circuit based on the data selected by the selection unit.

The present invention provides a motor driving device that is capable of accurately detecting current supplied to the motor.

The above and other objects, features, and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

The motor driving device according to the present invention will be described below in detail in connection with preferred embodiments while referring to the accompanying drawings.

Embodiment

Figure 1:
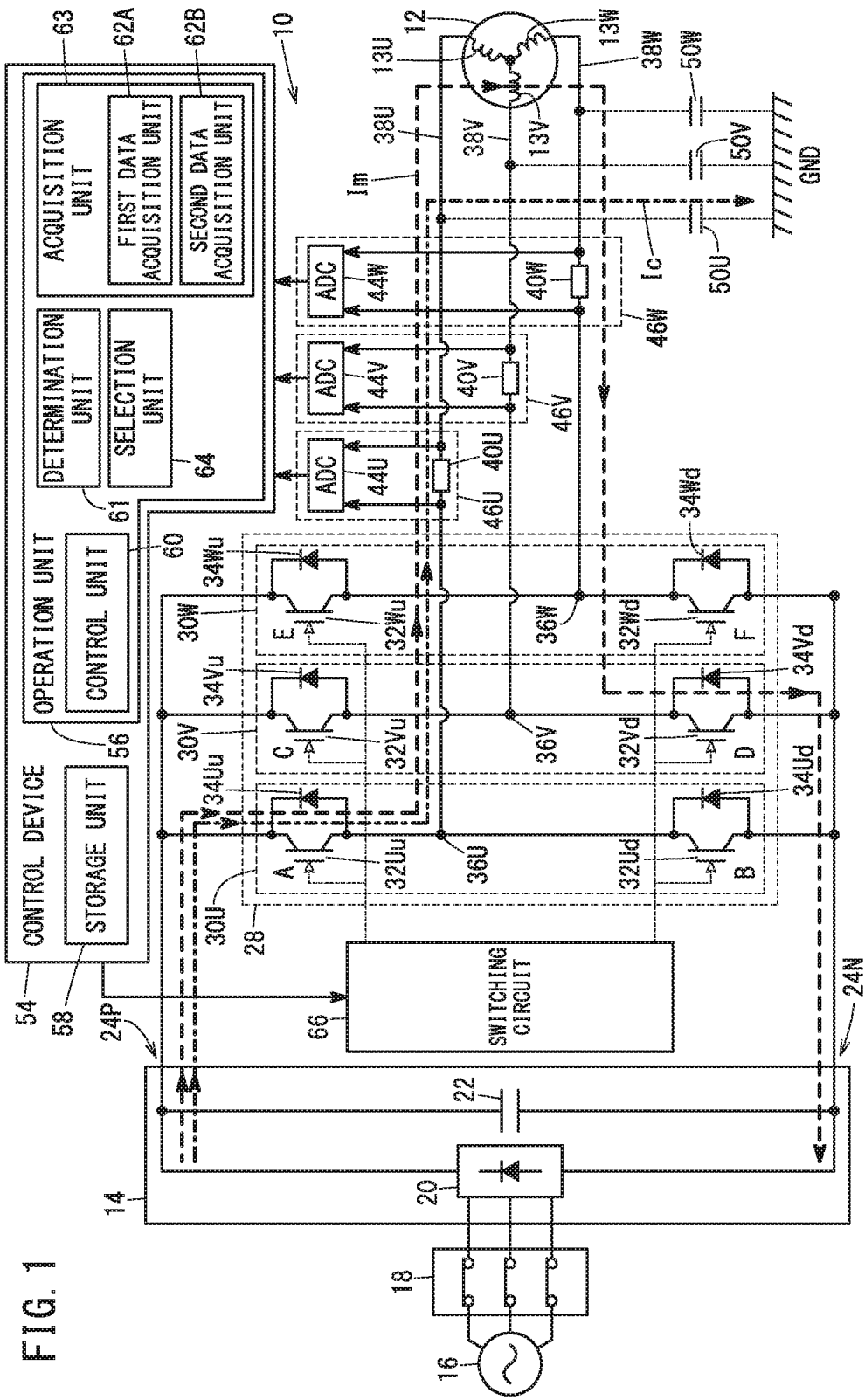
FIG. 1 is a diagram illustrating the configuration of a motor driving device according to an embodiment.

A motor driving device according to an embodiment will be described referring to FIGS. 1 to 8. FIG. 1 is a diagram illustrating a configuration of the motor driving device of the embodiment.

A motor driving device 10 of this embodiment can drive a motor 12. The description below will illustrate an example in which the motor 12 includes three-phase motor coils, i.e., a U-phase motor coil 13U, a V-phase motor coil 13V, and a W-phase motor coil 13W, but the configuration is not limited thereto. Reference numeral 13 will be used when generically describing the motor coils, and reference numerals 13U, 13V, 13W will be used to describe the individual motor coils.

The motor driving device 10 includes a converter unit 14. The converter unit 14 converts alternating-current voltage that is supplied from an alternating-current power supply 16 through a switch 18, into a direct-current voltage. The converter unit 14 is, for example, a known Pulse Width Modulation (PWM) converter, but is not limited thereto.

The alternating-current power supply 16 is, for example, a polyphase alternating-current power supply that supplies polyphase voltage, and more specifically is a three-phase alternating-current power supply, but is not limited thereto.

The switch 18 serves to turn on and off the supply of alternating-current voltage from the alternating-current power supply 16 to the motor driving device 10. The switch 18 can be, for example, a magnetic contactor, a breaker, etc., but is not limited thereto.

The converter unit 14 includes a rectifier circuit 20. The rectifier circuit 20 rectifies the alternating-current voltage that is supplied from the alternating-current power supply 16 through the switch 18, into a direct-current voltage.

The converter unit 14 further includes a smoothing capacitor 22. The smoothing capacitor 22 is disposed following the rectifier circuit 20. The smoothing capacitor 22 smooths the direct-current voltage that has been rectified by the rectifier circuit 20. The positive side of the rectifier circuit 20 is connected to one end of the smoothing capacitor 22. The other end of the rectifier circuit 20 is connected to the other end of the smoothing capacitor 22. One end of the smoothing capacitor 22 is connected to a positive-side output terminal 24P of the converter unit 14. The other end of the smoothing capacitor 22 is connected to a negative-side output terminal 24N of the converter unit 14.

The motor driving device 10 further includes an inverter unit 28. The inverter unit 28 can convert the direct-current voltage supplied from the converter unit 14 into alternating-current voltage, and supply the alternating-current voltage to the motor 12 to thereby drive the motor 12.

As mentioned above, the motor 12 includes the three-phase motor coils 13U, 13V, 13W. Accordingly, the inverter unit 28 includes power device units 30U, 30V, 30W in correspondence with the individual phases of the motor 12.

The power device unit 30U corresponds to the U-phase motor coil 13U. The power device unit 30U includes a switching device 32Uu on the upper arm side (upper arm side switching device) and a switching device 32Ud on the lower arm side (lower arm side switching device). The power device unit 30U further includes an upper arm side diode 34Uu and a lower arm side diode 34Ud.

The power device unit 30V corresponds to the V-phase motor coil 13V. The power device unit 30V includes an upper arm side switching device 32Vu, a lower arm side switching device 32Vd, an upper arm side diode 34Vu, and a lower arm side diode 34Vd.

The power device unit 30W corresponds to the W-phase motor coil 13W. The power device unit 30W includes an upper arm side switching device 32Wu, a lower arm side switching device 32Wd, an upper arm side diode 34Wu, and a lower arm side diode 34Wd.

The upper arm side switching device 32Uu of the power device unit 30U can connect the positive-side output terminal 24P of the converter unit 14 and the U-phase motor coil 13U. The upper arm side switching device 32Vu of the power device unit 30V can connect the positive-side output terminal 24P of the converter unit 14 and the V-phase motor coil 13V. The upper arm side switching device 32Wu of the power device unit 30W can connect the positive-side output terminal 24P of the converter unit 14 and the W-phase motor coil 13W.

The lower arm side switching device 32Ud of the power device unit 30U can connect the negative-side output terminal 24N of the converter unit 14 and the U-phase motor coil 13U. The lower arm side switching device 32Vd of the power device unit 30V can connect the negative-side output terminal 24N of the converter unit 14 and the V-phase motor coil 13V. The lower arm side switching device 32Wd of the power device unit 30W can connect the negative-side output terminal 24N of the converter unit 14 and the W-phase motor coil 13W.

Reference numeral 32 will be used when generically describing the switching devices, and reference numerals 32Uu, 32Ud, 32Vu, 32Vd, 32Wu, 32Wd will be used to describe the individual switching devices. Also, reference numeral $32u$ will be used when generically describing the switching devices on the upper arm side, and reference numerals 32Uu, 32Vu, 32Wu will be used to describe the individual upper arm side switching devices. Further, reference numeral $32d$ will be used when generically describing the switching devices on the lower arm side, and reference numerals 32Ud, 32Vd, 32Wd will be used to describe the individual lower arm side switching devices. The switching devices 32 can be, but are not limited to, Insulated Gate Bipolar Transistors (IGBTs), for example. Field Effect Transistors (FETs) may be used as the switching devices 32.

The upper arm side switching device $32u$ and the lower arm side switching device $32d$ are connected in series to each other. The upper arm side switching device $32u$ has its first terminal connected to the cathode of an upper arm side diode $34u$. The first terminal is a collector when the switching device 32 is an IGBT, for example, and the first terminal is one of a source and a drain when the switching device 32 is an FET, for example. The upper arm side switching device $32u$ has its second terminal connected to the anode of the upper arm side diode $34u$. The second terminal is an emitter when the switching device 32 is an IGBT, for example, and the second terminal is the other of the source and the drain when the switching device 32 is an FET, for example. The lower arm side switching device $32d$ has its first terminal connected to the cathode of a lower arm side diode $34d$. The lower arm side switching device $32d$ has its second terminal connected to the anode of the lower arm side diode $34d$.

A node 36U, which is connected to the second terminal of the switching device 32Uu, the anode of the diode 34Uu, the first terminal of the switching device 32Ud, and the cathode of the diode 34Ud, is connected to a U-phase line 38U.

A node 36V, which is connected to the second terminal of the switching device 32Vu, the anode of the diode 34Vu, the first terminal of the switching device 32Vd, and the cathode of the diode 34Vd, is connected to a V-phase line 38V.

A node 36W, which is connected to the second terminal of the switching device 32Wu, the anode of the diode 34Wu, the first terminal of the switching device 32Wd, and the cathode of the diode 34Wd, is connected to a W-phase line 38W. Reference numeral 36 will be used when generically describing the nodes, and reference numerals 36U, 36V, 36W will be used to describe the individual nodes.

The lines 38U, 38V, 38W are used to supply the polyphase alternating-current voltage from the inverter unit 28 to the motor 12. Reference numerals 38 will be used when generically describing the lines, and reference numerals 38U, 38V, 38W will be used to describe the individual lines.

The U-phase motor coil 13U is connected to the second terminal of the upper arm side switching device 32Uu and the first terminal of the lower arm side switching device 32Ud through the line 38U. The V-phase motor coil 13V is connected to the second terminal of the upper arm side switching device 32Vu and the first terminal of the lower arm side switching device 32Vd through the line 38V. The W-phase motor coil 13W is connected to the second terminal of the upper arm side switching device 32Wu and the first terminal of the lower arm side switching device 32Wd through the line 38W.

The inverter unit 28 suitably switches the upper arm side switching devices $32u$ and the lower arm side switching devices $32d$, to thereby convert the direct-current voltage output from the converter unit 14 into an alternating-current voltage so as to drive the motor 12.

The motor driving device 10 further includes current sensors 46U, 46V, 46W. Reference numeral 46 will be used when generically describing the current sensors, and reference numerals 46U, 46V, 46W will be used to describe the individual current sensors. The current sensors 46U, 46V, 46W respectively include resistors 40U, 40V, 40W and A/D converters 44U, 44V, 44W. Reference numeral 40 will be used when generically describing the resistors, and reference numerals 40U, 40V, 40W will be used to describe the individual resistors. Reference numeral 44 will be used when generically describing the A/D converters, and reference numerals 44U, 44V, 44W will be used to describe the individual A/D converters.

The resistors 40U, 40V, 40W are provided on the lines 38U, 38V, 38W, respectively. Each resistor 40 has its one end connected to the corresponding node 36 through part of the line 38 and its other end connected to the corresponding motor coil 13 through another part of the line 38.

The A/D converter 44U has one of its input terminals connected to one end of the resistor 40U and the other of its input terminals connected to the other end of the resistor 40U. The A/D converter 44V has one of its input terminals connected to one end of the resistor 40V and the other of its input terminals connected to the other end of the resistor 40V. The A/D converter 44W has one of its input terminals connected to one end of the resistor 40W and the other of its input terminals connected to the other end of the resistor 40W.

The A/D converters 44U, 44V, 44W convert analog signals corresponding to the voltage at both ends of the resistors 40U, 40V, 40W into digital signals, respectively. The current sensors 46U, 46V, 46W supply, to a control device 54, the digital signals output respectively from the A/D converters 44U, 44V, 44W.

Stray capacitances (parasitic capacitances) 50U, 50V, 50W are present on the lines 38U, 38V, 38W, respectively. Reference numeral 50 will be used when generically describing the stray capacitances, and reference numerals 50U, 50V, 50W will be used to describe the individual stray capacitances.

The motor driving device 10 further includes a switching circuit (control circuit) 66. The switching circuit 66 is configured to control switching operations of the switching devices 32 of the inverter unit 28. The switching circuit 66 switches the switching devices 32 by applying a voltage to a third terminal (gate) of the switching device 32 on the basis of a signal (command) supplied from a control unit 60. The switching circuit 66 supplies, to the control device 54, a signal indicating whether the switching circuit 66 has switched the switching devices 32.

The motor driving device 10 further includes the control device 54. The control device 54 serves to control the entire motor driving device 10. The control device 54 includes an operation unit 56 and a storage unit 58. The operation unit 56 may be, but is not limited to, a Central Processing Unit (CPU) etc., for example. The storage unit 58 may include volatile memory (not shown) and nonvolatile memory (not shown), for example. Examples of the volatile memory include Random Access memory (RAM) etc., for example. Examples of the nonvolatile memory include Read Only Memory (ROM), flash memory, etc., for example. Programs, data, tables, etc. can be stored in the storage unit 58.

The operation unit 56 includes the control unit 60, a determination unit 61, an acquisition unit 63, and a selection unit 64. The control unit 60, the determination unit 61, the acquisition unit 63, and the selection unit 64 can be realized as the operation unit 56 executes a program stored in the storage unit 58.

Figure 2:
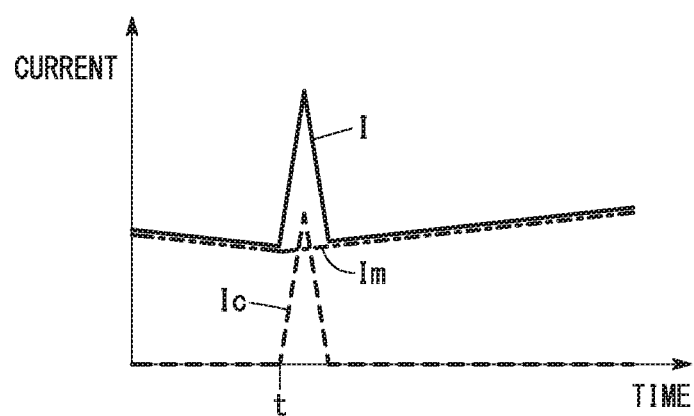
FIG. 2 is a graph illustrating an example of currents at the time of switching.

The control unit 60 suitably switches the switching devices 32 using the switching circuit 66. FIG. 2 is a graph showing an example of currents at the time of switching. FIG. 2 shows an example where the switching device 32 switches at timing t. The horizontal axis in FIG. 2 shows time and the vertical axis in FIG. 2 shows current. The current Im shows a current flowing to the motor 12. The current Ic shows a current flowing to the stray capacitance 50, i.e., a transient current. The current I shows a current flowing in the line 38 at the time of switching, more specifically a current flowing to the resistor 40 at the time of switching.

When the switching device 32 is switched, the transient current Ic flows in the line 38, more specifically to the stray capacitance 50. When the transient current Ic flows, the current sensor 46 can detect a sum of the current Im supplied to the motor 12 and the transient current Ic. On the other hand, when no transient current Ic flows, the current sensor 46 can detect the current Im supplied to the motor 12. For the purpose of accurately determining the current Im supplied to the motor 12, it is preferable to use a current value that has been acquired in a period in which no transient current Ic flows. Accordingly, this embodiment selects a current value that has been acquired in a period other than given periods (transient periods) P1, P2 (see FIG. 4) in which the transient current Ic flows due to switching of the switching devices 32. Reference sign P will be used when generically describing the given periods, and reference signs P1, P2 will be used to describe the individual given periods.

The acquisition unit 63 includes a plurality of data acquisition units 62A, 62B. Reference numeral 62 will be used when generically describing the data acquisition units, and reference numerals 62A, 62B will be used to describe the individual data acquisition units. In order to simplify description, an example will be shown below in which the acquisition unit 63 includes the first data acquisition unit 62A and the second data acquisition unit 62B, but the configuration is not limited to this example. The acquisition unit 63 may include three or more data acquisition units 62.

The first data acquisition unit 62A acquires first data DAn (see FIG. 4) indicating the current flowing in the line 38 in a first period T1 (see FIG. 4), on the basis of the output of the current sensor 46. The first period T1 is a data acquisition period that the first data acquisition unit 62A requires in order to acquire a piece of first data DAn. The first data acquisition unit 62A sequentially acquires pieces of first data DAn while time-sequentially shifting the timing to start the data acquisition period (first period T1) at a first time interval $\Delta T1$. The letter "n" indicates serial numbers. Reference sign DA will be used when generically describing the first data, and reference signs DAn will be used to describe the individual pieces of first data.

The second data acquisition unit 62B acquires second data DBm (see FIG. 4) indicating the current flowing in the line 38 in a second period T2 (see FIG. 4) that is longer than the first period T1, on the basis of the output of the current sensor 46. The second period T2 is a data acquisition period that the second data acquisition unit 62B requires in order to acquire a piece of second data DBm. The second data acquisition unit 62B sequentially acquires pieces of second data DBm while time-sequentially shifting the timing to start the data acquisition period (second period T2) at a second time interval $\Delta T2$. The letter "m" indicates serial numbers. Reference sign DB will be used when generically describing the second data, and reference sign DBm will be used to describe the individual pieces of second data. The second time interval $\Delta T2$ may be equivalent to or different from the above-mentioned first time interval $\Delta T1$. Reference sign DA will be used when generically describing the first data as mentioned above, reference sign DB will be used when generically describing the second data as mentioned above, and reference sign D will be used when generically describing data acquired by the data acquisition unit 62. As stated above, the data acquisition period of the first data acquisition unit 62A is the first period T1. Also, as stated above, the data acquisition period of the second data acquisition unit 62B is the second period T2 that is longer than the first period T1. The acquisition unit 63 including such data acquisition units 62 can acquire multiple pieces of data D in the data acquisition periods T1 and T2 having different lengths.

In this embodiment, the first data DA measured in a relatively short period and the second data DB measured in a relatively long period are acquired for the reasons below. That is, periods other than the given periods P, in which the transient current Ic flows in the line 38 due to switching of the switching devices 32, may be relatively long or relatively short. If the period other than the given period P is relatively long, selecting the second data DB measured in the relatively long period is preferable. This is because the current value can be determined more accurately in cases where the current value is determined based on the second data DB measured in the relatively long period, than in cases where the current value is determined based on the first data DA measured in the relatively short period. When the period other than the given period P is relatively short, there is no choice but to select the first data DA measured in the relatively short period.

The control unit 60 requests, e.g., at a third time interval, the selection unit 64 to select the data D for determining the current value being supplied to the motor 12. The third time interval may be equivalent to or different from the above-described first time interval ΔT1 and the second time interval ΔT2. The data D for determining the current value being supplied to the motor 12 may be irregularly requested from the control unit 60 to the selection unit 64.

The determination unit 61 can determine whether the switching circuit 66 has switched the switching devices 32, on the basis of a signal supplied from the switching circuit 66.

The determination unit 61 can determine whether the latest piece of first data DA is one that has been acquired in a period other than the given period P. The determination unit 61 can also determine whether the latest piece of second data DB is one that has been acquired in a period other than the given period P.

The selection unit 64 can select a piece of data D from among multiple pieces of data D acquired by the acquisition unit 63, based on the timing that the switching circuit 66 switched the switching devices 32.

The selection unit 64 can preferentially select a piece of data D from among multiple pieces of data D that have been acquired in periods other than given periods P in which the transient current Ic flows in the line 38 due to switching of the switching devices 32. This is because the current value can be determined more accurately in cases where the current value is determined based on data D acquired in the period other than the given period P, than in cases where the current value is determined based on data D acquired in a period overlapping the given period P.

The selection unit 64 can preferentially select a latest piece of data D from among multiple pieces of data D acquired in the periods other than the given periods P. This is because the current value at the present time can be determined more accurately in cases where the current value is determined based on the latest piece of data D, than in cases where the current value is determined based on data D acquired before the latest piece of data D.

When there are multiple pieces of latest data D among multiple pieces of data D acquired in periods other than given periods P, the selection unit 64 can select the data acquired in the longest data acquisition period from among the multiple pieces of latest data. For example, when a first timing and a second timing are the same, the selection unit 64 can perform the process shown below. The first timing is the timing of completion of the acquisition of the latest piece of first data DA, among multiple pieces of first data DA acquired in periods other than the given periods P. The second timing is the timing of completion of the acquisition of the latest piece of second data DB, among multiple pieces of second data DB acquired in periods other than the given periods P. In this case, the selection unit 64 can select the latest piece of second data DB from among the multiple pieces of second data DB acquired in the periods other than the given periods P. This is because the current value can be determined more accurately in cases where the current value is determined based on the second data DB measured in the relatively long period, than in cases where the current value is determined based on the first data DA measured in the relatively short period.

The control unit 60 can determine the current value being supplied to the motor 12 on the basis of the data D selected by the selection unit 64 and can suitably control the switching circuit 66 based on the determined current value.

Figure 3:
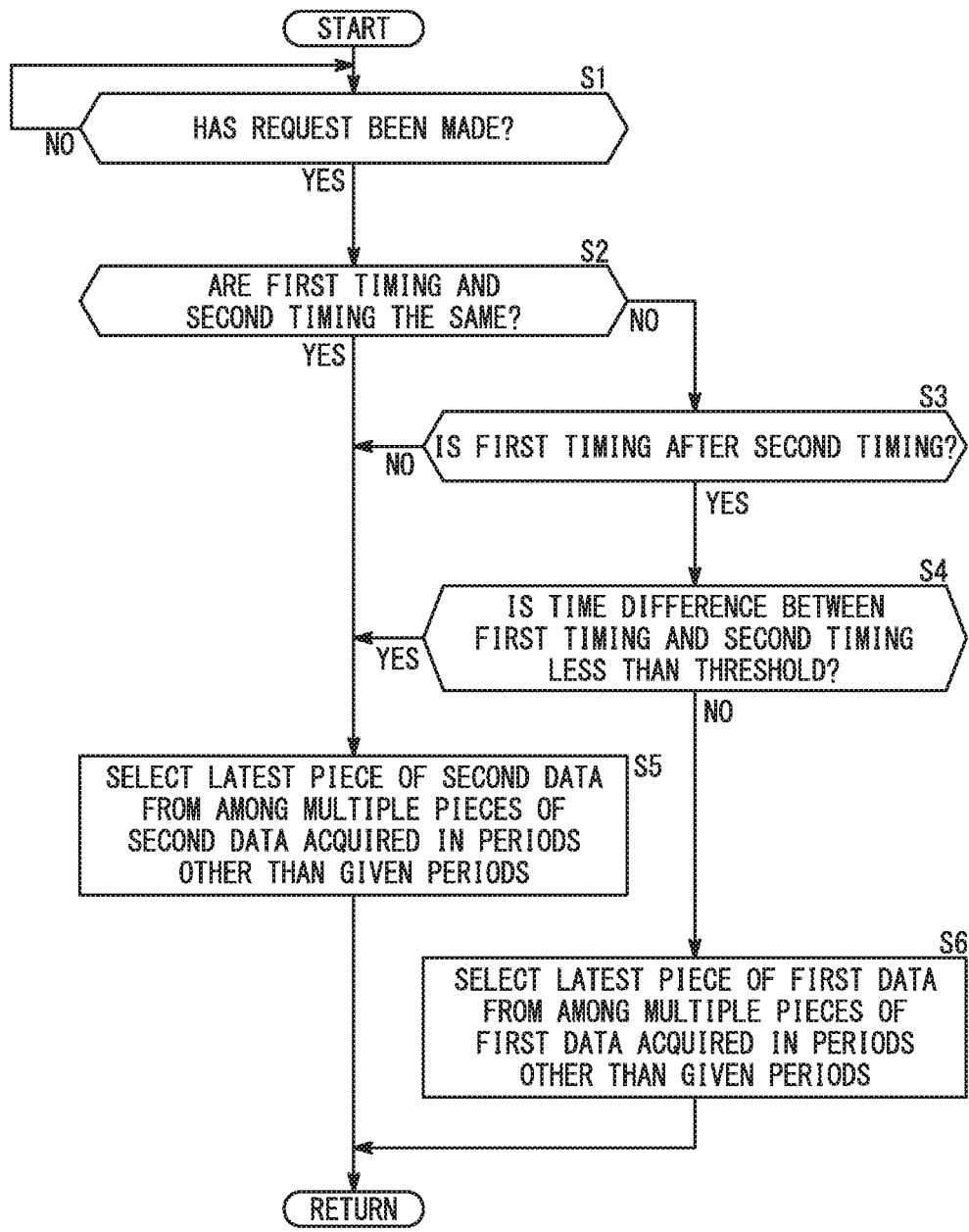
FIG. 3 is a flowchart illustrating an exemplary process performed by the motor driving device of the embodiment.

An example of operations of the motor driving device 10 of this embodiment will be described referring to FIG. 3. FIG. 3 is a flowchart showing an example of operations of the motor driving device of this embodiment. FIG. 3 shows an exemplary process for acquiring the data D.

At step S1, the determination unit 61 and the selection unit 64 determine whether the control unit 60 has requested the data D for determining the current value being supplied to the motor 12. If such a request has not been made from the control unit 60 (NO at step S1), the operation of step S1 is repeated. When such a request has been made from the control unit 60 (YES at step S1), the process moves to step S2.

At step S2, the determination unit 61 determines whether the first timing and the second timing are the same. If the first timing and the second timing are not the same (NO at step S2), the process moves to step S3. The process moves to step S5 if the first timing and the second timing are the same (YES at step S2).

At step S3, the determination unit 61 determines whether the first timing is after the second timing. If the second timing is after the first timing (NO at step S3), the process moves to step S5. The process moves to step S4 if the first timing is after the second timing (YES at step S3).

At step S4, the determination unit 61 determines whether a time difference between the first timing and the second timing is less than a threshold TH. The threshold TH is a threshold used to determine which is to be selected between the latest piece of first data DA among multiple pieces of first data DA acquired in periods other than the given periods P and the latest piece of second data DB among multiple pieces of second data DB acquired in periods other than the given periods P. If the time difference between the first timing and the second timing is less than the threshold TH (YES at step S4), the process moves to step S5. The process moves to step S6 if the time difference between the first timing and the second timing is equal to or larger than the threshold TH (NO at step S4).

At step S5, the selection unit 64 selects the latest piece of second data DB from among the multiple pieces of second data DB acquired in periods other than the given periods P. The process shown in FIG. 3 terminates when step S5 has finished.

At step S6, the selection unit 64 selects the latest piece of first data DA from among the multiple pieces of first data DA acquired in periods other than the given periods P. The process shown in FIG. 3 terminates when step S6 has finished.

Figure 4:
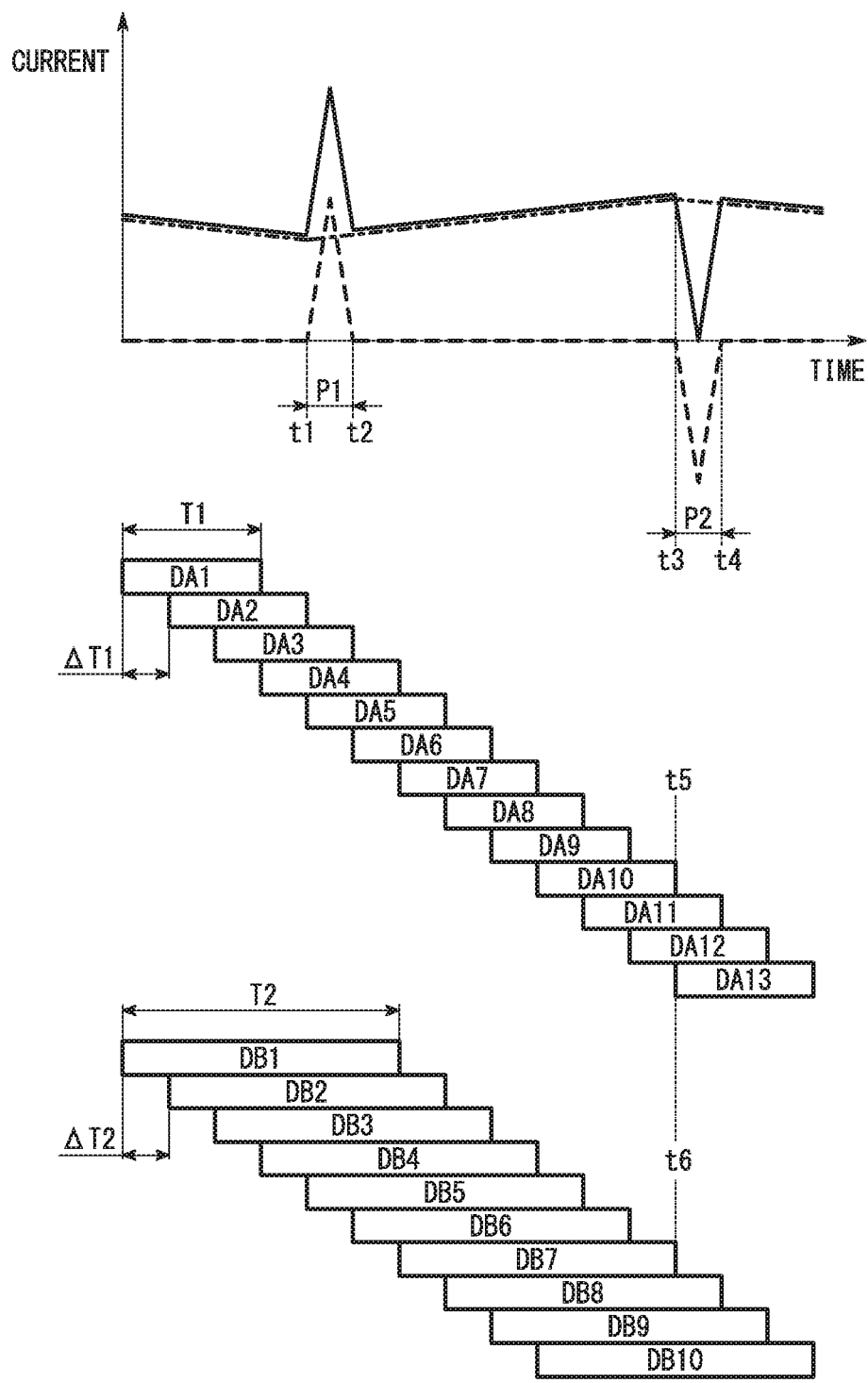
FIG. 4 is a time chart illustrating an exemplary operation performed by the motor driving device of the embodiment.

Examples of operation of the motor driving device 10 of this embodiment will be described referring to FIGS. 4 to 7. FIGS. 4 to 7 are time charts showing exemplary operations of the motor driving device of this embodiment. FIG. 4 shows an example in which the first timing t5 and the second timing t6 are the same.

Timings t1, t3 are timings of switching of the switching devices 32. Timing t1 is a switching timing that precedes the latest switching timing of the switching devices 32. Timing t3 is the latest switching timing of the switching devices 32. Period P1 from timing t1 to timing t2 is a given period in which the transient current Ic flows due to the switching made at timing t1. Period P2 from timing t3 to timing t4 is a given period in which the transient current Ic flows due to the switching made at timing t3.

If the control unit 60 requests at timing t3 the data D for determining the current value being supplied to the motor 12, the following operation is performed.

Among the multiple pieces of first data DA acquired in periods other than the given periods P, the latest piece of first data DA is the first data DA10. Also, among the multiple pieces of second data DB acquired in periods other than the given periods P, the latest piece of second data DB is the second data DB7.

As stated above, the first timing t5 and the second timing t6 are the same. As explained above, the first timing t5 is the timing of completion of the acquisition of the latest piece of first data DA, among the multiple pieces of first data DA acquired in periods other than the given periods P. Further, as explained above, the second timing t6 is the timing of completion of the acquisition of the latest piece of second data DB, among the multiple pieces of second data DB acquired in periods other than the given periods P. In the example shown in FIG. 4, since the first timing t5 and the second timing t6 are the same, there are multiple pieces of latest data D, among the multiple pieces of data D acquired in periods other than the given periods P. In the example shown in FIG. 4, from among the multiple latest pieces of data D acquired in periods other than the given periods P, the second data DB7 that is the data D acquired in the longest data acquisition period is selected.

Figure 5:
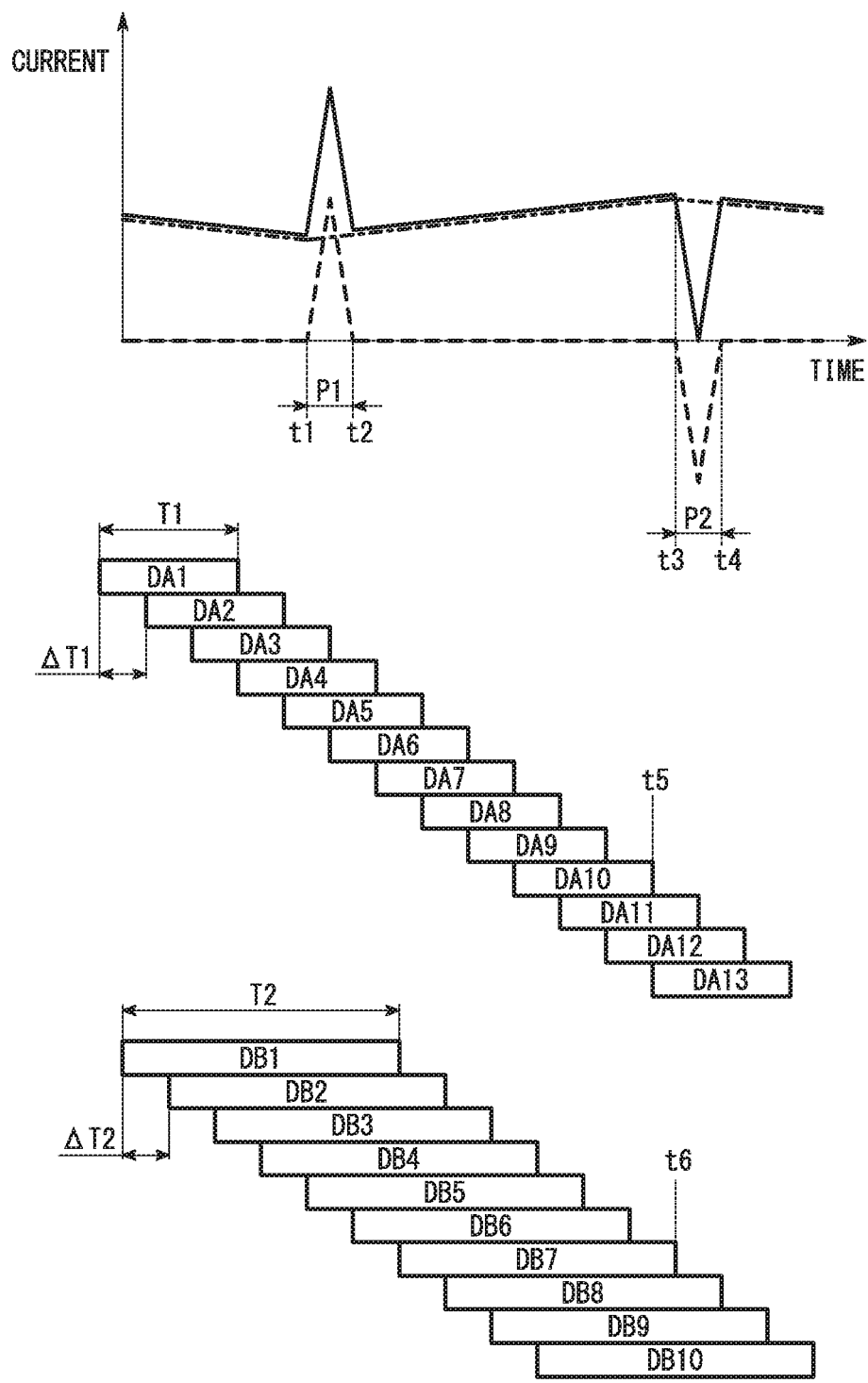
FIG. 5 is a time chart illustrating an exemplary operation performed by the motor driving device of the embodiment.

FIG. 5 shows a case where the second timing t6 is after the first timing t5. In the example shown in FIG. 5, the second timing t6 is after the first timing t5. Accordingly, in the example shown in FIG. 5, the latest piece of second data DB7 is selected from among the multiple pieces of second data DB acquired in periods other than the given periods P.

Figure 6:
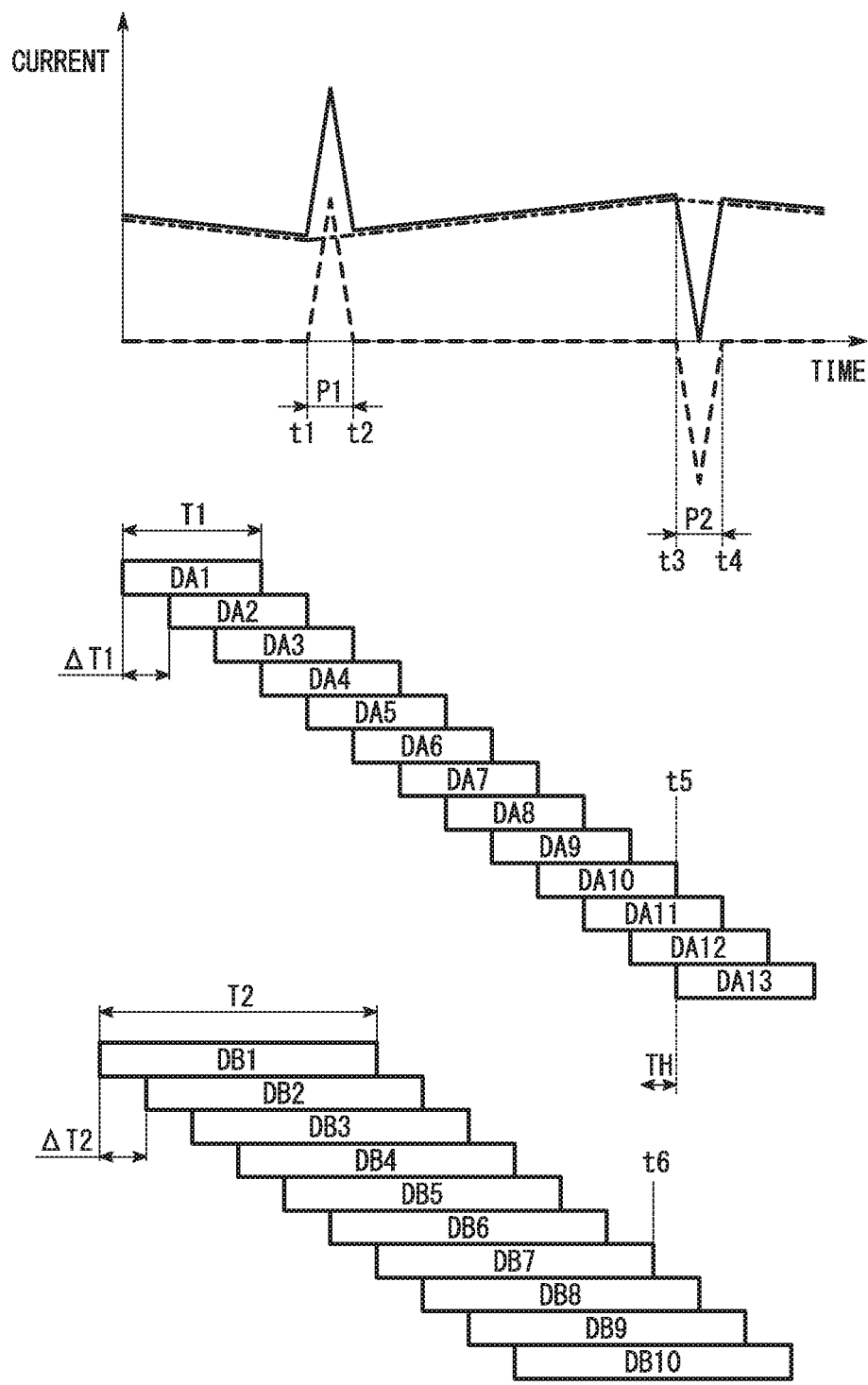
FIG. 6 is a time chart illustrating an exemplary operation performed by the motor driving device of the 15 embodiment.

FIG. 6 shows a case where the first timing t5 is after the second timing t6. In the example shown in FIG. 6, the first timing t5 is after the second timing t6, but the time difference between the first timing t5 and the second timing t6 is less than the threshold TH. Accordingly, in the example shown in FIG. 6, the latest piece of second data DB7 is selected from among the multiple pieces of second data DB acquired in periods other than the given periods P.

Figure 7:
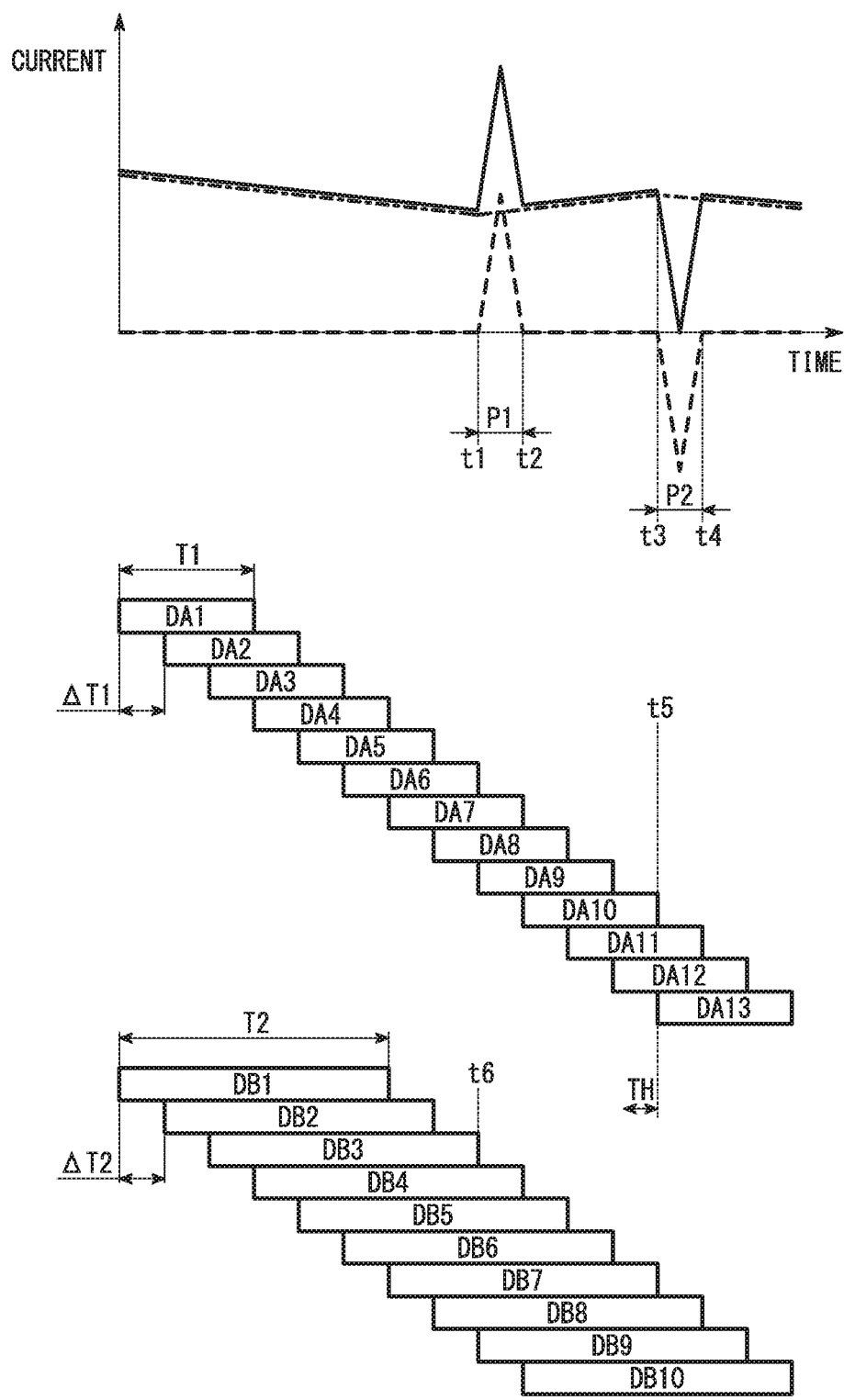
FIG. 7 is a time chart illustrating an exemplary operation performed by the motor driving device of the embodiment.
Figure 8:
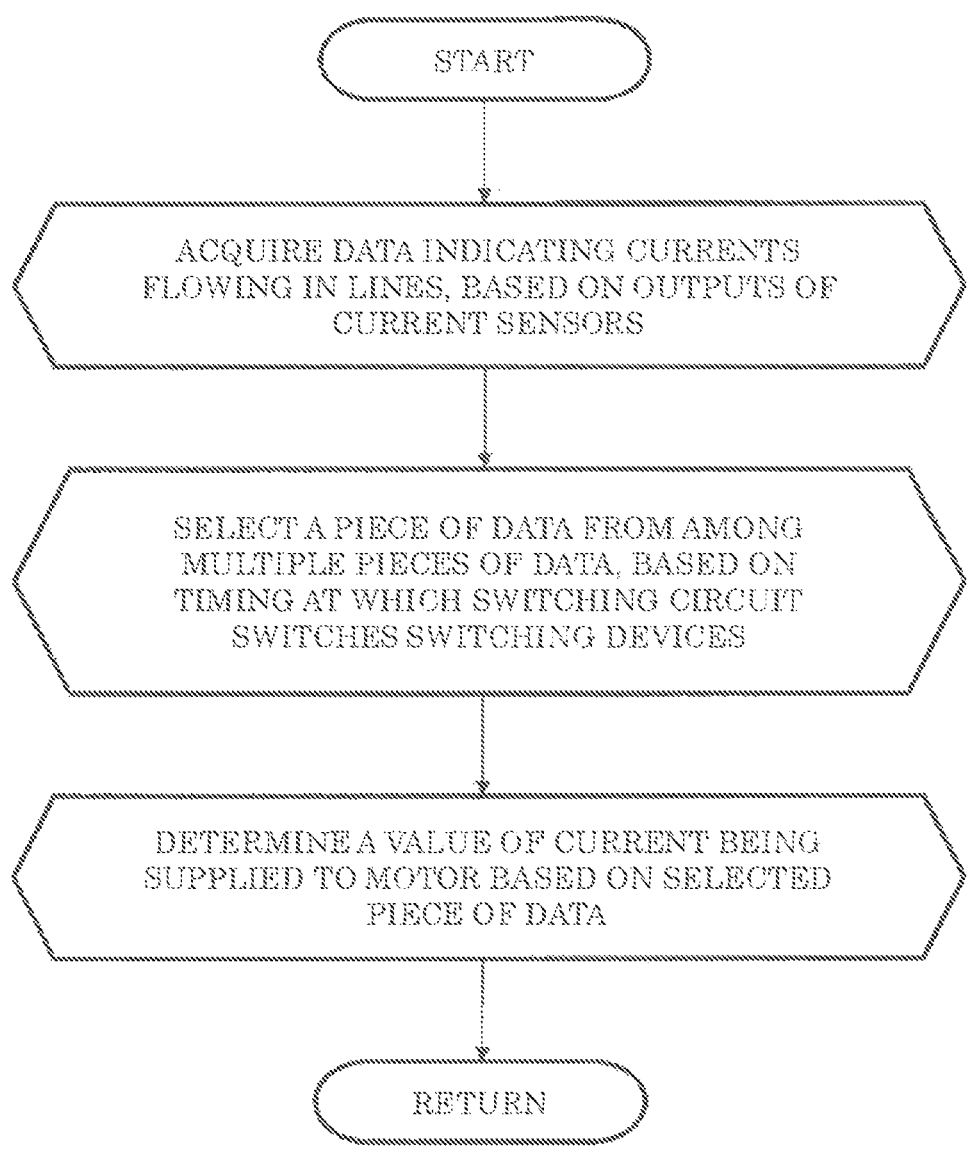
FIG. 8 is a flowchart illustrating an exemplary process performed by the motor driving device of the embodiment.

FIG. 7 shows a case where the first timing t5 is after the second timing t6 and the time difference between the first timing t5 and the second timing t6 is larger than or equal to the threshold TH.

In the example shown in FIG. 7, the first timing t5 is after the second timing t6 and the time difference between the first timing t5 and the second timing t6 is larger than or equal to the threshold TH. Accordingly, in the example shown in FIG. 7, the latest piece of first data DA10 is selected from among the multiple pieces of first data DA acquired in periods other than the given periods P.

In this way, in this embodiment, multiple pieces of data D for which data acquisition periods are different are acquired. Hence, this embodiment makes it possible to accurately detect the current value based on a suitable piece of data D among multiple pieces of data D.

According to this embodiment, a piece of data D is preferentially selected from among multiple pieces of data D acquired in periods other than given periods P in which the transient current Ic flows to the stray capacitance 50 due to switching. The current value can be determined more accurately in cases where the current value is determined based on data D acquired in the period other than the given period P, than in cases where the current value is determined based on data D acquired in a period overlapping the given period P. Thus, according to this embodiment, it is possible to determine the current value more accurately.

Further, according to this embodiment, a latest piece of data D is preferentially selected from among multiple pieces of data D acquired in periods other than the given periods P. The current value at the present time can be determined more accurately in cases where the current value is determined based on the latest data D, than in cases where the current value is determined based on data D acquired before the latest data D. Thus, according to this embodiment, it is possible to determine the current value more accurately.

Further, according to this embodiment, when there are multiple pieces of latest data D among multiple pieces of data D acquired in periods other than the given periods P, the data D measured in the longest data acquisition period is preferentially selected from among the multiple pieces of latest data D. The current value can be determined more accurately in cases where the current value is determined based on the data D measured in a relatively long data acquisition period, than in cases where the current value is determined based on the data D measured in a relatively short data acquisition period. Thus, according to this embodiment, it is possible to determine the current value more accurately.

While preferred embodiments of the present invention have been described above, the present invention is not limited to the above-described embodiments but can be modified in various manners without departing from the essence and gist of the invention.

The embodiments described above can be summarized as follows.

A motor driving device (10) includes: an inverter unit (28) including a plurality of power device units (30U, 30V, 30W) respectively including switching devices (32Uu, 32Vu, 32Wu, 32Ud, 32Vd, 32Wd), the inverter unit being configured to convert a direct-current voltage into a polyphase alternating-current voltage; a switching circuit (66) configured to switch the switching devices; current sensors (46U, 46V, 46W) provided on lines (38U, 38V, 38W) configured to supply the polyphase alternating-current voltage to a motor (12); an acquisition unit (63) configured to acquire data (DAn, DBm) indicating currents flowing in the lines, based on outputs of the current sensors, the acquisition unit acquiring multiple pieces of data in data acquisition periods having different lengths; a selection unit (64) configured to select a piece of data from among the multiple pieces of data acquired by the acquisition unit, based on timing at which the switching circuit switches the switching devices; and a control unit (60) configured to control the switching circuit based on the data selected by the selection unit. This configuration makes it possible to detect the current value appropriately on the basis of a suitable one of multiple pieces of data.

The acquisition unit may include at least a first data acquisition unit (62A) and a second data acquisition unit (62B). The first data acquisition unit may be configured to sequentially acquire pieces of first data (DAn) for which the data acquisition period is a first period, while time-sequentially shifting timing to start the data acquisition period, and the second data acquisition unit may be configured to sequentially acquire pieces of second data (DBm) for which the data acquisition period is a second period that is longer than the first period, while time-sequentially shifting timing to start the data acquisition period.

The selection unit may be configured to select a piece of data from among multiple pieces of data that have been acquired in periods other than a given period (P1, P2) in which a transient current (Ic) flows in the lines due to the switching of the switching devices. This configuration enables more accurate determination of the current value since the selection unit selects data that has been acquired in a period other than the given period in which the transient current flows to the stray capacitance due to switching.

The selection unit may be configured to select a latest piece of data from among the multiple pieces of data acquired in the periods other than the given period. This configuration enables more accurate determination of the current value since the selection unit preferentially selects the latest one of the multiple pieces of data that have been acquired in periods other than the given period.

If there are multiple pieces of latest data among the multiple pieces of data acquired in the periods other than the given period, the selection unit may be configured to select data acquired in a longest one of the data acquisition periods from among the multiple pieces of latest data. According to this configuration, selecting the data acquired in the longest data acquisition period enables more accurate determination of the current value.

If a first timing corresponding to completion of acquisition of a latest piece of the first data among multiple pieces of the first data that have been acquired in periods other than a given period in which a transient current flows in the lines due to the switching of the switching devices is after a second timing corresponding to completion of acquisition of a latest piece of the second data among multiple pieces of the second data that have been acquired in periods other than the given period, and if a time difference between the first timing and the second timing is less than a threshold, then the selection unit may be configured to select the latest piece of the second data.

What is claimed is:

1. A motor driving device comprising:
   an inverter unit including a plurality of power device units respectively including switching devices, the inverter unit being configured to convert a direct-current voltage into a polyphase alternating-current voltage;
   a switching circuit configured to switch the switching devices;
   current sensors provided on lines configured to supply the polyphase alternating-current voltage to a motor;
   a processor; and
   a memory that stores instructions,
   wherein the instructions when executed by the processor cause the motor driving device to:
     acquire data indicating currents flowing in the lines, based on outputs of the current sensors, wherein the data to be acquired includes multiple pieces of data in data acquisition periods having different lengths;
     select a piece of data from among the multiple pieces of data acquired, based on timing at which the switching circuit switches the switching devices;
     perform at least first data acquisition and second data acquisition;
     in the first data acquisition, sequentially acquire pieces of first data for each piece of which the data acquisition period is a first period, wherein timings to start the data acquisition period are time-sequentially shifted by a first time interval; and
     in the second data acquisition, sequentially acquire pieces of second data for each piece of which the data acquisition period is a second period that is longer than the first period, wherein timings to start the data acquisition period are shifted by a second time interval,
   wherein
     the first time interval is shorter than the first period,
     the second time interval is shorter than the second period, and
     the first period and the second period are overlapping.

2. The motor driving device according to claim 1, wherein the instructions, when executed by the processor, further cause the motor driving device to: select a piece of data from among multiple pieces of data that have been acquired in periods other than a given period in which a transient current flows in the lines due to the switching of the switching devices.

3. The motor driving device according to claim 1, wherein the instructions, when executed by the processor, further cause the motor driving device to: select a piece of data from among multiple pieces of data that have been acquired in periods other than a given period in which a transient current flows in the lines due to the switching of the switching devices.

4. The motor driving device according to claim 2, wherein the instructions, when executed by the processor, further cause the motor driving device to: select a latest piece of data from among the multiple pieces of data acquired in the periods other than the given period.

5. The motor driving device according to claim 3, wherein the instructions, when executed by the processor, further cause the motor driving device to: select a latest piece of data from among the multiple pieces of data acquired in the periods other than the given period.

6. The motor driving device according to claim 4, wherein, if there are multiple pieces of latest data among the multiple pieces of data acquired in the periods other than the given period, the instructions, when executed by the processor, further cause the motor driving device to select data acquired in a longest one of the data acquisition periods from among the multiple pieces of latest data.

7. The motor driving device according to claim 5, wherein, if there are multiple pieces of latest data among the multiple pieces of data acquired in the periods other than the given period, the instructions, when executed by the processor, further cause the motor driving device to select data acquired in a longest one of the data acquisition periods from among the multiple pieces of latest data.

8. The motor driving device according to claim 1, wherein, if a first timing corresponding to completion of acquisition of a latest piece of the first data among multiple pieces of the first data that have been acquired in periods other than a given period in which a transient current flows in the lines due to the switching of the switching devices is after a second timing corresponding to completion of acquisition of a latest piece of the second data among multiple pieces of the second data that have been acquired in periods other than the given period, and if a time difference between the first timing and the second timing is less than a threshold, the instructions, when executed by the processor, further cause the motor driving device to select the latest piece of the second data.

9. A method for controlling a motor driving device, the method comprising:
acquiring data indicating currents flowing in lines, based on outputs of current sensors, wherein the data to be acquired includes multiple pieces of data in data acquisition periods having different lengths, wherein the current sensors are provided on the lines that are configured to supply polyphase alternating-current voltage to a motor;
selecting a piece of data from among the multiple pieces of data acquired, based on timing at which a switching circuit switches switching devices, wherein the switching circuit is configured to switch the switching devices of a power device unit of an inverter unit, wherein the inverter unit is configured to convert a direct-current voltage into the polyphase alternating-current voltage;
performing at least first data acquisition and second data acquisition;
in the first data acquisition, sequentially acquiring pieces of first data for each piece of which the data acquisition period is a first period, wherein timings to start the data acquisition period are time-sequentially shifted by a first time interval; and
in the second data acquisition, sequentially acquiring pieces of second data for each piece of which the data acquisition period is a second period that is longer than the first period,
wherein timings to start the data acquisition period are shifted by a second time interval,
wherein
the first time interval is shorter than the first period,
the second time interval is shorter than the second period, and
the first period and the second period are overlapping.

10. The method according to claim 9, the method further comprising selecting a piece of data from among multiple pieces of data that have been acquired in periods other than a given period in which a transient current flows in the lines due to the switching of the switching devices.

11. The method according to claim 9, the method further comprising selecting a piece of data from among multiple pieces of data that have been acquired in periods other than a given period in which a transient current flows in the lines due to the switching of the switching devices.

12. The method according to claim 10, the method further comprising selecting a latest piece of data from among the multiple pieces of data acquired in the periods other than the given period.

13. The method according to claim 12, the method further comprising selecting a latest piece of data from among the multiple pieces of data acquired in the periods other than the given period.

14. The method according to claim 13, wherein, if there are multiple pieces of latest data among the multiple pieces of data acquired in the periods other than the given period, the instructions, when executed by the processor, further cause the motor driving device to select data acquired in a longest one of the data acquisition periods from among the multiple pieces of latest data.

15. The method according to claim 14, wherein, if there are multiple pieces of latest data among the multiple pieces of data acquired in the periods other than the given period, the instructions, when executed by the processor, further cause the motor driving device to select data acquired in a longest one of the data acquisition periods from among the multiple pieces of latest data.

16. The method according to claim 9, wherein, if a first timing corresponding to completion of acquisition of a latest piece of the first data among multiple pieces of the first data that have been acquired in periods other than a given period in which a transient current flows in the lines due to the switching of the switching devices is after a second timing corresponding to completion of acquisition of a latest piece of the second data among multiple pieces of the second data that have been acquired in periods other than the given period, and if a time difference between the first timing and the second timing is less than a threshold, the instructions, when executed by the processor, further cause the motor driving device to select the latest piece of the second data.

* * * * *